US010920137B2

(12) United States Patent
Lüchinger et al.

(10) Patent No.: US 10,920,137 B2
(45) Date of Patent: Feb. 16, 2021

(54) LUMINESCENT CRYSTALS AND MANUFACTURING THEREOF

(71) Applicant: Avantama AG, Stäfa (CH)

(72) Inventors: Norman Albert Lüchinger, Meilen (CH); Marek Oszajca, Zürich (CH)

(73) Assignee: Avantama AG, Stäfa (CH)

( * ) Notice: Subject to any disclaimer, the term of this patent is extended or adjusted under 35 U.S.C. 154(b) by 487 days.

(21) Appl. No.: 15/745,839

(22) PCT Filed: May 25, 2016

(86) PCT No.: PCT/CH2016/000081
§ 371 (c)(1),
(2) Date: Jan. 18, 2018

(87) PCT Pub. No.: WO2017/020137
PCT Pub. Date: Feb. 9, 2017

(65) Prior Publication Data
US 2018/0208840 A1    Jul. 26, 2018

(30) Foreign Application Priority Data
Jul. 31, 2015  (EP) .................................. 15002279

(51) Int. Cl.
C09K 11/66    (2006.01)
B01J 2/00     (2006.01)
C09K 11/61    (2006.01)
C09D 11/50    (2014.01)
C01G 21/00    (2006.01)
C09K 11/02    (2006.01)
(Continued)

(52) U.S. Cl.
CPC ............... C09K 11/665 (2013.01); B01J 2/00 (2013.01); C01G 21/006 (2013.01); C09D 11/50 (2013.01); C09K 11/025 (2013.01); C09K 11/616 (2013.01); H01L 31/02322 (2013.01); H01L 33/502 (2013.01); H01L 2933/0083 (2013.01)

(58) Field of Classification Search
CPC .... C09K 11/665; C09K 11/025; C09K 11/616
See application file for complete search history.

(56) References Cited

FOREIGN PATENT DOCUMENTS

| EP | 2 631 008 A1 | 8/2013 |
| JP | 2014-078392 A | 5/2014 |
| JP | 201478392 A | 5/2014 |

(Continued)

OTHER PUBLICATIONS

International Search Report for corresponding International Application No. PCT/CH2016/000081 dated Jul. 27, 2016.
(Continued)

Primary Examiner — C Melissa Koslow
(74) Attorney, Agent, or Firm — Renner, Otto, Boisselle & Sklar, LLP

(57) ABSTRACT

The present invention relates to the field of luminescent crystals (LCs), and more specifically to Quantum Dots (QDs) of formula $M^1{}_aM^2{}_bX_c$, wherein the substituents are as defined in the specification. The invention provides methods of manufacturing such luminescent crystals, particularly by dispersing suitable starting materials in the presence of a liquid and by the aid of milling balls; to compositions comprising luminescent crystals and to electronic devices, decorative coatings; and to intermediates comprising luminescent crystals.

28 Claims, 2 Drawing Sheets

(51) Int. Cl.
    *H01L 31/0232*    (2014.01)
    *H01L 33/50*    (2010.01)

(56)    References Cited

FOREIGN PATENT DOCUMENTS

| JP | 2015113360 A | 6/2015 |
|---|---|---|
| JP | 2015113361 A | 6/2015 |
| WO | 2004/041964 A1 | 5/2004 |
| WO | 2007/109734 A2 | 9/2007 |
| WO | 2014/007966 A1 | 1/2014 |
| WO | 2015/085441 A1 | 6/2015 |

OTHER PUBLICATIONS

Written Opinion of the International Searching Authority for corresponding International Application No. PCT/CH2016/000081 dated Jul. 27, 2016.

International Preliminary Report on Patentability for corresponding International Application No. PCT/CH2016/000081 dated Nov. 23, 2017.

Zhang et al., "Solution-phase Synthesis of Cesium Lead Halide Perovskite Nanowires", Journal of the American Chemical Society, vol. 137, No. 29, Jul. 29, 2015, pp. 9230-9233 (cited in specification on p. 2).

Protesescu et al., "Nanocrystals of Cesium Lead Halide Perovskites ($CsPbX_3$, X=Cl, Br, and I): Novel Optoelectronic Materials Showing Bright Emission with Wide Color Gamut", Nano Letters, vol. 15, No. 6, Jun. 10, 2015, pp. 3692-3696 (cited in specification on p. 1).

LUMINESCENT CRYSTALS AND MANUFACTURING THEREOF

This application is a national phase of International Application No. PCT/CH2016/000081 filed May 25, 2016 and published in the English language, and claims priority to European Application No. 15002279.6 filed on Jul. 31, 2015, which are incorporated herein by reference.

The present invention relates to the field of luminescent crystals (LCs), and more specifically to Quantum Dots (QDs). The invention provides methods of manufacturing such luminescent crystals, to compositions comprising luminescent crystals and to electronic devices, decorative coatings and intermediates comprising LCs.

Luminescent Crystals, specifically Quantum Dots, are a known class of materials. Such QDs find many applications in industrial and commercial products, including electronic devices, such as light emitting diodes or displays.

Loredana Prodesescu et al. (Nano Lett., 2015, 15, 3692-3696) discloses a new class of luminescent quantum dots (QDs) of high quality. QDs were synthesized with cheap chemicals and with very high size precision; QD size was controlled by adjusting the synthesis parameters such as temperature and reaction time. However, only very small amounts were synthesized, as the method is difficult to control (due to the very fast particle growth kinetics of this material composition) and difficult in scale-up. Further, the reaction is non-stoichiometric, resulting in a large amount of by-products. Furthermore, the reaction can only be conducted in high-boiling solvents like octadecene (due to the high reaction temperatures) which requires a solvent-exchange if the QD's are needed in a low-boiling solvent like toluene for the final application. This synthesis route is known as "hot injection method", using standard laboratory equipment. Due to these disadvantages, the method of synthesizing QDs is commercially not attractive rendering the QDs expensive.

Pfenninger et al (WO2007109734) discloses similar materials but obtained in the form of thin films by vacuum deposition. Again, such manufacturing methods are considered disadvantageous.

Guo et al (WO2014/007966) discloses standard luminescent QDs of the core-shell type based on CdSe or InP further comprising C5-C8 carboxylic acids. The standard CdSe and InP require a semiconducting shell of bigger bandgap (e.g. ZnS) in order to reach desired optical functionality. This additional synthetic step increases further their price, what is disadvantageous for a number of applications.

Dandang Zhang et al (JACS 2015, p.9230-33) disclose solution phase synthesis of cesium lead halide perovskite nanowires. Like Prodesescu, cited above, the document discloses the hot injection method using standard laboratory equipment to obtain nanowires. Such nanowires are no quantum dots.

Kojima Akihiro et al (JP2014078392) disclose electroluminescent elements comprising perovskite compounds. The perovskites are obtained by a specific solution process, termed melt-dissolving. This is a bottom-up approach comprising the step of crystallizing the target compound. Such processes are difficult in upscaling and difficult to control.

Thus, it is an object of the present invention to mitigate at least some of these drawbacks of the state of the art. In particular, it is an aim of the present invention to provide improved manufacturing methods of LCs/QDs. It is a further aim to provide new materials comprising LCs/QDs suitable for a wide variety of applications, including electronic devices, and optical devices and decorative coatings.

These objectives are achieved by a method for manufacturing luminescent crystals as disclosed herein, an ink containing the luminescent crystals and a surfactant as disclosed herein, an intermediate good including a sheet-like substrate coated with at least one layer comprising a composition containing the luminescent crystals as disclosed herein and the uses of the composition as disclosed herein. Further aspects of the invention are disclosed in the specification and independent claims, preferred embodiments are disclosed in the specification and the dependent claims. The invention particularly provides for a method for manufacturing luminescent crystals, specifically quantum dots ($1^{st}$ aspect);

compositions in the form of a suspension, also termed "ink", or "pre-polymer dispersion", and its uses ($2^{nd}$ aspect);

a solid polymer composition and its uses ($3^{rd}$ aspect);

an intermediate good ($4^{th}$ aspect);

a device, including electronic devices, optical devices and articles comprising a coated surface ($5^{th}$ aspect);

a method for manufacturing of a polymer composition ($6^{th}$ aspect);

a method for manufacturing an intermediate good ($7^{th}$ aspect); and a method for manufacturing a device ($8^{th}$ aspect).

The present invention will be described in detail below. It is understood that the various embodiments, preferences and ranges as provided/disclosed in this specification may be combined at will. Further, depending of the specific embodiment, selected definitions, embodiments or ranges may not apply.

Unless otherwise stated, the following definitions shall apply in this specification:

The terms "a", "an," "the" and similar terms used in the context of the present invention are to be construed to cover both the singular and plural unless otherwise indicated herein or clearly contradicted by the context. Further, the terms "including", "containing" and "comprising" are used herein in their open, non-limiting sense. The term "containing" shall include both, "comprising" and "consisting of".

Percentages are given as weight-%, unless otherwise indicated herein or clearly contradicted by the context.

The term "luminescent crystals" (LC) is known in the field and relates to nanocrystals of 2-50 nm, made of semiconductor materials. The term comprises quantum dots, typically in the range of 3-15 nm and nanocrystals of up to 50 nm. Preferably, luminescent crystals are approximately isometric (such as spherical or cubic). Particles are considered approximately isometric, in case the aspect ratio (longest:shortest direction) of all 3 orthogonal dimensions is 1-2.

LCs show, as the term indicates, luminescence. In the context of the present invention a luminescent crystal typically is a single-crystalline particle spatially separated from other particles due to the presence of a surfactant. It is a semiconducting material which exhibits a direct bandgap (typically in the range 1.1-3.8 eV, more typically 1.4-3.5 eV, even more typically 1.7-3.2 eV). Upon illumination with electromagnetic radiation equal or higher than the bandgap, the valence band electron is excited to the conduction band leaving an electron hole in the valence band. The formed exciton (electron-electron hole pair) then radiatively recombines in the form of photoluminescence, with maximum intensity centered around the LC bandgap value and exhibiting photoluminescence quantum yield of at least 1%. In contact with external electron and electron hole sources LC could exhibit electroluminescence. In the context of the present invention LCs do not exhibit mechano-luminescence (e.g. piezoluminescence), chemiluminescence, electrochemiluminescence nor thermoluminescence.

The term "quantum dot" (QD) is known and particularly relates to semiconductor nanocrystals, which have a diameter typically between 3-15 nm. In this range, the physical diameter of the QD is smaller than the bulk excitation Bohr radius, causing quantum confinement effect to predominate. As a result the electronic states of the QD, and therefore the bandgap, are a function of the QD composition and physical size, i.e. the color of absorption/emission is linked with the QD size. The optical quality of the QDs sample is directly linked with their homogeneity (more monodisperse QDs will have smaller FWHM of the emission). When QD reach size bigger than the Bohr radius the quantum confinement effect is hindered and the sample may not be luminescent anymore as nonradiative pathways for exciton recombination may become dominant. Thus, QDs are a specific sub-group of nanocrystals, defined in particular by its size and size distribution. Properties of the QDs are directly linked with these parameters, distinguishing them from nanocrystals.

The term "solvent" is known in the field and particularly includes aliphatic hydrocarbons, aromatic hydrocarbons, ethers (including glyclol-ethers), esters, alcohols, ketones. The above organics can be substituted or unsubstituted by one or more substituents, for example by halogen (such as fluoro), Hydroxy, C1-4 alkoxy (such as methoxy or ethoxy) and alkyl (such as methyl, ethyl, isopropyl). The above organics include linear, branched and cyclic derivatives. There can also be unsaturated bonds in the molecule. The above compounds typically have 4-24 carbon atoms, preferably 5-12 carbon atoms, most preferably 6-10 carbon atoms.

The terms "surfactant", "ligand", "dispersant" and "dispersing agent" are known in the field and have essentially the same meaning. In the context of the present invention, these terms denote an organic substance, other than a solvent, which is used in suspensions or colloids to improve the separation of particles and to prevent agglomeration or settling. Without being bound to theory, it is believed that surfactants are physically or chemically attached on the particle surface either before or after adding the particles to the solvent and thereby provide the desired effects. The term surfactants includes polymer materials and small molecules; surfactants typically contain polar functional end-groups and apolar end-groups. In the context of the present invention, solvents (e.g. toluene) are not considered surfactants.

The term "suspension" is known and relates to a heterogeneous fluid of an internal phase (i.p.) that is a solid and an external phase (e.p.) that is a liquid. The external phase comprises one or more dispersants/surfactants, optionally one or more solvents and optionally one or more pre-polymers.

The term "polymer" is known and includes organic and inorganic synthetic materials. The term "pre-polymer" shall include both, monomers and oligomers.

The term "solution-processing" is known in the field and denotes the application of a coating or thin film to a substrate by the use of a solution-based (=liquid) starting material. In the context of the present invention, solution processing relates to the fabrication of commercial products, such as electronic devices, optical devices, and articles comprising (decorative) coatings and also to the fabrication of intermediate goods comprising a QD composite or QD layer. Typically the application of the suspension(s) is/are conducted at ambient conditions.

The term "QD composite" denotes a solid inorganic/organic composite material comprising LCs/QD, surfactant and a matrix. The form of a QD composite includes films, fibers and bulk material. QD composites are used for applications where the LCs/QD's only have an optical function, as the LCs/QD's are not electronically addressed.

In QD composites, the LCs/QD's are embedded in a matrix, such as a polymer matrix or an inorganic matrix, in order to spatially separate the LCs/QD's from each other. Depending on the use, the thickness of a QD composite film may vary over a broad range, but typically is 1-1000 microns.

The term "QD layer" denotes a thin layer comprising luminescent crystals (specifically QDs) and surfactant and are free of, or essentially free of additional components, such as matrix/binder. QD layers may find various applications, including quantum dot light emitting diodes (QLED) or quantum dot solar cells. In these applications, the LCs/QDs are electronically addressed; a current flows through the QD-layer by applying a voltage. Depending on the use, the thickness of a QD layer may vary over a broad range, but typically is 3-200 nm, preferably 5-100 nm, most preferably 6-30 nm. A QD layer can be composed of a monolayer of LCs/QDs, thus having a thickness equal to the size of the LCs/QDs used and thus defining a lower limit of the thickness.

The present invention will be better understood by reference to the figures.

FIGS. 1(a) and (b) outlines the various aspects of the present invention. In FIG. 1b, x-axis shows particle size, y axis shows number of particles.

Figure 1A:
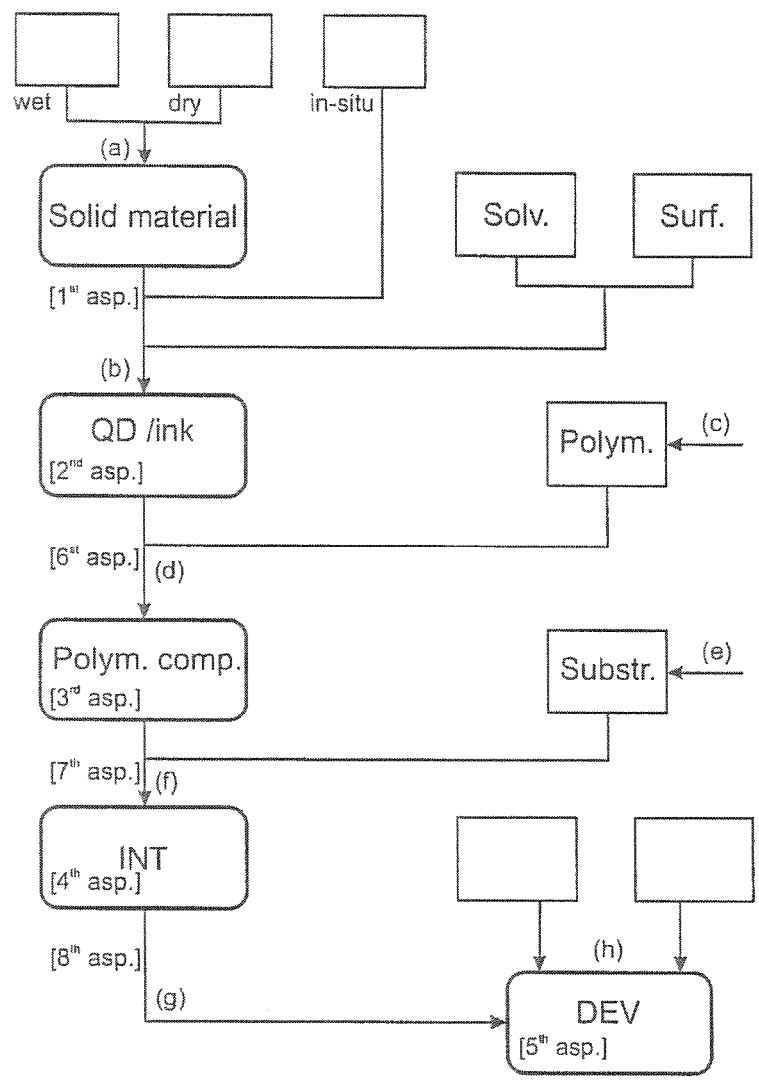

In a first aspect, the invention relates to a method for manufacturing luminescent crystals, specifically luminescent crystals from the class of quantum dots. More specifically, the invention relates to a method for manufacturing luminescent crystals of 2-50 nm size, preferably 3-15 nm size, said luminescent crystals being selected from compounds of formula (I)

$$M^1{}_a M^2{}_b X_c \qquad (I),$$

wherein
  $M^1$ represents one or more alkaline metals selected from Cs, Rb, K, Na, Li
  $M^2$ represents one or more metals selected from the group consisting of Ge, Sn, Pb, Sb, and Bi,
  X represents one or more anions selected from the group consisting of chloride, bromide, iodide, cyanide, thiocyanate, isothiocyanate and sulfide, preferably one or more halogenides selected from the group consisting of Cl, Br, and I,
  a represents 1-4
  b represents 1-2
  c represents 3-9;
said method comprising the steps of (a) providing a solid material as defined below; and (b) dispersing said material in the presence of a liquid as defined below.

This aspect of the invention shall be explained in further detail below.

It is known that LCs/QDs are materials sensitive to the environment. First they tend to aggregate what induces the non-radiative recombination paths, leading to reduced luminescence quantum yield. Accordingly, measures have to be taken to stabilize the LCs/QDs once synthesized. The method described herein meets with this requirement by disclosing an improved manufacturing method to provide LCs/QDs in the form of a stable suspension ("ink").

The method described herein may be considered a "top down" approach, as material is first conventionally synthesized and then reduced in size and stabilized to obtain LCs/QDs. This approach is opposite to what is known and described in Kovalenko (discussed above), which is a "bottom up" approach. The inventive method is further illustrated, but not limited by the experiments provided below.

The method described herein provides LCs/QDs having excellent properties. First, small FWHM values (Width of the emission peak; e.g. 19 nm for emission at 507 nm) are observed. Second, high luminescence quantum yields are observed (e.g. 71% for emission at 507 nm). Accordingly, the LCs/QDs provided by the inventive method are suited for a large number of applications in electronic and optical devices. Further, the LCs/QDs provided by the inventive method are also suited for coating (non-electronic/non-optical) articles, such as a decorative coating.

The inventive method is superior, when compared to known manufacturing methods. First, it is much more robust and can be easily up-scaled. Second, it requires less starting materials and produces less by-products. Third, no solvent exchange to low-boiling solvents (e.g. toluene) is required after the LCs/QDs synthesis because the synthesis can directly take place in low-boiling solvents. As a result, the manufacturing costs are significantly reduced, making LCs/QDs available for a large number of applications.

Luminescent Crystals/Quantum Dots of formula (I): The inventive method provides for LCs/QDs having an average size of 2-50 nm, in particular of 3-15 nm. The LCs/QDs further have a narrow size distribution, as indicated by the low FWHM values of the emission peaks.

In one embodiment, the invention relates to LCs/QDs of formula (I), where $a=1$, $b=1$, $c=3$.

In one embodiment, the invention relates to LCs/QDs of formula (I), where $M^1$=Cs.

In one embodiment, the invention relates to LCs/QDs of formula (I), where $M^2$=Pb.

In one embodiment, the invention relates to LCs/QDs of formula (I), where X is a combination of at least two elements selected from the list of Cl, Br, I.

In one embodiment, the invention relates to LCs/QDs of formula (I), selected from $Cs_1Pb_1X_3$, particularly $CsPbBr_3$, $CsPbBr_2I$. This embodiment also includes corresponding molar mixtures of CsBr and PbBr2 or mixtures of CsI and PbBr2.

In one further embodiment, the invention relates to LCs/QDs of formula (I) further including doped materials, i.e. wherein part of $M^1$ is replaced by other alkaline metals, or wherein part of $M^2$ is replaced by other transition metals or rare earth elements or wherein part of X is replaced by other halogenides.

In one further embodiment the invention relates to LCs/QDs of formula (I), selected from $M^1SnX_3$, $M^1_3Bi_2X_9$, $M^1GeX_3$.

The compounds of formula (I) include stoichiometric and non-stoichiometric compounds. Compounds of formula (I) are stoichiometric, in case a, b and c represent a natural number; they are non-stoichiometric, in case a, b and c represent an integer. In one further embodiment the invention relates to LCs/QDs of formula (I) wherein part of X is replaced by one or more anions selected from the group consisting of cyanide, thiocyanate, isothiocyanate and sulfide. As exemplary embodiments are identified $$M^1_a M^2_b X^1_{c'} X^2_{c''} \qquad (I-1),$$

wherein
$M^1$, $M^2$, a, b are as identified above;
$X^1$ represents halogenides as identified;
$X^2$ represents an anion selected from cyanide, thiocyanate, isothiocyanate and sulfide;
$c'+c''$ represents a real number from 3 to 9 and $c'/c''>0.9$.
As sulfide is 2-, it counts twice when calculating $c''$.

Exemplary embodiments of formula (I-1) include $CsPbCl_{2.9}CN_{0.1}$ $CsSnBr_2(SCN)_1$, $Cs_3Bi_2Br_{8.8}(NCS)_{0.2}$, and $CsPbBr_{0.43}I_{2.43}S_{0.07}$.

Solid Material: Suitable Solid material provided in step (a) has an average particle size of at least 15 nm and a poly-disperse size distribution, typically 15 nm-100 μm, more typically 50 nm-50 μm. The particle size of the solid material shall be determined by SEM, TEM or BET.

Further, such solid material has a chemical composition that corresponds to the chemical composition of the desired LCs/QDs. Accordingly, such solid material has a stoichiometric composition of a moles $M^1$, b moles $M^2$ and c moles X.

Such material may be provided to the inventive process by different approaches, e.g. (a1) (a2), (a3) as outlined below. The material may be provided to step (b) either continuously or discontinuously by known methods.

Figure 1B:
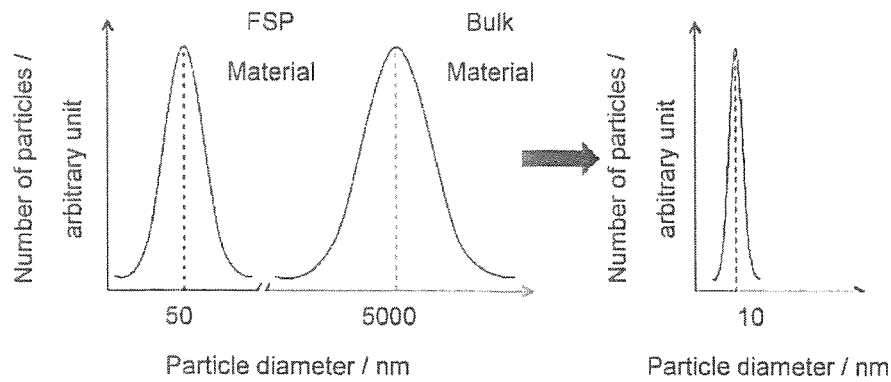

Wet synthetic process (a1): Manufacturing of solid material according to formula (I) is known per se. The most common methods include wet synthetic processes such as precipitation processes from a solvent based or aqueous phase. The material may be provided to step (b) either continuously or discontinuously by known methods. This approach may be considered "top-down": Solid starting materials available by wet synthesis exhibit a polydisperse particle size distribution with an average particle size of >15 nm (measured by BET, SEM or TEM) whereas synthesized luminescent crystals exhibit a very narrow size distribution with an average size of 2-50 nm (see FIG. 1b). By following the methods described herein, the average particle size and polydispersity of the starting material is reduced in order to obtain a narrow size distribution and a particle size of 2-50 nm.

Dry synthetic process in a gas phase (a2-1): An alternative approach for manufacturing of solid material according to formula (I) includes dry synthetic process in a gas phase, particularly decomposition and pyrolysis processes e.g. Flame Spray Pyrolysis Process. The solid materials obtained by this process are typically smaller, compared to (a1).

This approach may also be considered "top-down": Solid starting materials available by dry synthesis exhibit a polydisperse particle size distribution with an average particle size of >15 nm (measured by BET, SEM or TEM) whereas synthesized luminescent crystals exhibit a very narrow size distribution with an average size of 2-50 nm (see FIG. 1b). Accordingly, at least part of the starting material is reduced in size.

Dry synthetic process by milling (a2-2): A further approach for manufacturing of solid material according to formula (I) includes dry milling of precursor materials. In this embodiment, the solid material is a mixture of two or more dry precursors having the formulae $aM^1_1X_1$ and $M^2_b X_{(c-a)}$, where the substituents are defined as above. For example, $CsPbBr3$, $Cs4PbBr6$, are accessible by corresponding molar mixtures of the precursors CsBr and PbBr2 or CsPbBr2I being accessible by corresponding mixtures of precursors CsI and PbBr2. The dry crystalline material according to formula (I) is then obtained in a dry milling process, e.g. using a pestle and mortar or a process including agitated milling balls. This process can be regarded as a solid state reaction induced by milling.

In situ formation (a3): A further alternative for a solid material according to formula (I) includes in situ formation, such as solid state reaction during the dispersing process. In this embodiment, the solid material is a mixture of two or more dry precursors having the formulae $aM^1{}_1X_1$ and $M^2{}_b X_{(c-a)}$, where the substituents are defined above. For example CsPbBr3, Cs4PbBr6, are accessible by corresponding molar mixtures of the precursors CsBr and PbBr2 or CsPbBr2I being accessible by corresponding mixtures of precursors CsI and PbBr2. The crystalline material according to formula (I) is then formed during the dispersing process (i.e. in situ) by reaction of the two precursors of the solid material.

The above precursors, in turn, are available by known methods, such as wet synthetic processes, dry synthetic processes. The skilled person is in a position to select suitable precursors to obtain luminescent crystals of formula (I). Again, this approach may also be considered "top-down", as the precursors used are larger than the LCs/QDs obtained.

In one embodiment the average particle size of the solid material is at least 15 nm (determined by BET, SEM or TEM), preferably between 15 nm-100 μm, more preferably 50 nm-50 μm.

In an advantageous embodiment, the solid material consists of a single composition having the same stoichiometry as the final LCs/QDs of formula (I).

Step (b): Without being bound to theory, it is believed that upon dispersion of the starting material in the liquid phase a number of effects occur simultaneously or subsequently.

First, the solid material is evenly distributed within the liquid phase.

Second, the solid material is contacted with the surfactant. It is believed that the material is thereby coated and stabilized in the liquid phase.

Third, the particle size of the solid material is reduced. Without being bound to theory it is believed that a monodisperse particle size distribution is obtained by two occurring mechanisms: (1) mechanical crushing/cleaving of particles larger than the final LCs/QD size, (2) Ostwald ripening and sintering of particles smaller than the final LCs/QD size.

In a specific embodiment, the average particle size of the solid starting material is at least 1.5 times (preferably at least 2 times, most preferably at least 5 times) higher than the average particle size of the correspondingly synthesized LCs/QDs.

Liquid: As outlined above, dispersion of step (b) is performed in a liquid phase. Suitable liquids may be selected from (i) liquid surfactants, (ii) a combination of (liquid or solid) surfactant and solvent, (iii) a combination of (liquid or solid) surfactant, solvent and (liquid or solid) pre-polymer or polymer and (iv) a combination of (liquid or solid) surfactant and liquid pre-polymer.

In embodiment (i), the liquid phase consists of (or essentially consists of) liquid surfactants. This embodiment is advantageous, as it is a simple system without the use of solvents.

In embodiment (ii), the liquid phase consists of (or essentially consists of) a combination of (liquid or solid) surfactant and solvent(s). This embodiment is advantageous, as it allows the use of solid surfactants.

In embodiment (iii), the liquid phase consists of (or essentially consists of) a combination of (liquid or solid) surfactant, solvent(s) and (liquid or solid) pre-polymer or polymer. This embodiment is advantageous, as This embodiment is advantageous, as it provides a composition that may be directly used for manufacturing intermediates as defined below.

In embodiment (iv), the liquid phase consists of (or essentially consists of) liquid pre-polymer. This embodiment is advantageous, as it provides a composition that is free of solvents and that may be directly used for manufacturing intermediates as defined below.

Solvent: The term solvent is defined above. For avoidance of doubt, the term solvent does neither include surfactants nor pre-polymers.

Advantageously, the solvent is selected from the group of hydrocarbons (including linear, branched and cyclic hydrocarbons), aromatic hydrocarbons, ethers (including glycol-ethers), esters, alcohols, ketones. Preferably the solvent is selected from the group of linear and branched $C_{5-24}$ alkanes, said alkanes being unsubstituted or substituted by phenyl or naphtyl. Most preferably, the solvent is selected from the group of linear $C_{5-15}$ alkanes and toluene.

In a further embodiment the solvent exhibits a boiling point below 140° C., preferably below 120° C. As a beneficial aspect of the inventive method, it is now possible to obtain LCs/Us at much lower temperature when compared to previous methods, such as Protesescu or Zhang (both discussed above, using synthesis methods of 140-200° C.)

Pre-Polymer: The term pre-polymer is defined above. Advantageously, the pre-polymer is selected from the group of acrylates, carbonates, sulfones, epoxies, vinyls, urethanes, imides, esters, furanes, melamines, styrenes, and silicones. Preferably, the pre-polymer is selected from the group of acrylates, urethanes, styrenes. Particularly preferably, the pre-polymer is selected from the group of acrylates.

Surfactant: A broad variety of surfactants may be used in the context of the present invention. Suitable surfactants may be determined in routine experiments; its choice depends mainly on the polymer used in the next step and the nature of solid material. Surfactants may be selected from the class of non-ionic surfactants, cationic surfactants, zwitterionic surfactants and anionic surfactants. It is known in the art to combine two or more surfactants to improve positive properties; such combination of surfactants being also subject to the present invention.

Non-ionic surfactants include: maleic polymers such as Poly(maleic anhydride-alt-1-octadecene), polyamines, alkylamines,(e.g. N-alkyl-1,3-propylene-diamines, N-alkyl-dipropylene-triamines, N-alkyltripropylene-tetraamines, N-alkylpolypropylene-polyamines,) poly-(ethyleneimine), polyesters, alkyl esters (e.g. cetyl palmitate), alkyl polyglycol ethers (such as fatty alcohol polyglycol ether with 3-25 ethoxy units (EO), e.g. Dehypon E124) and oxoalcohol polyglycolether), mixed alkyl/aryl polyglycolethers, alkyl polyglucosides (APGs), fatty alcohols, such as stearyl alcohols (e.g. Lorol C18TM) Non-ionic surfactants further include polymeric ethoxylate and/or propoxylate (EO/PO) adduct surfactants, such as fatty alcohol alkoxylates, alcohol EO/PO adducts (including fatty alcohol EO/PO adducts, oxo alcohol EO/PO adducts), EO/PO block-copolymers, ethylene diamine ethylene oxide-propylene oxide (EO/PO) block-copolymers, endcapped (fatty) alcohol EO adducts and EO/PO adducts (e.g. butyl endcapped), esters of carboxylic acids, in particular EO/PO adducts and sorbitan esters (e.g. from the group of SPAN).

Non-ionic surfactants further include alkoxy-silanes and hydrolyzed products thereof.

Non-ionic surfactants further include alkylphosphines, alkylphosphine oxides (e.g. trioctylphosphine oxide—TOPO) and alkylthiols.

Non-ionic surfactants further include alkyl esters of fatty acids (e.g. cetyl palmitate, lauric acid, capric acid).

A preferred class of non-ionic surfactants are alkylimines alkylamines, e.g. dioctylamine, oleylarnine, octadecylamine, hexadecylamine.

Cationic surfactants include: alkylammonium halides, more specifically alkyltrimethylammonium halides e.g. cetyltrimethylammonium bromide, dial kyldimethylammonium halides such as e.g. distearyldimethylammonium chloride, trialkylmethylammonium halides e.g. trioctylmethylammonium chloride, diquarternary polydimethylsiloxanes.

Zwitterionic surfactants include: betaines, such as caprylic glycinate, cocamidopropylbetain, and disodium cocoampho diacetate.

Anionic surfactants include sulfates, sulfonates, phosphates, and carboxylates. Specific examples include phosphate esters of alkyl ethers, ammonium lauryl sulfate, alkali lauryl sulfate and the related alkyl-ether sulfates e.g. alkali laureth sulfate.

A preferred class of anionic surfactants are carboxylates from the class of fatty acids, such as oleic acid, stearic acid, palmitic acid.

In a preferred embodiment the surfactant is selected from the following list: SP 13300, SP 20000, SP 24000SC, SP 41000, SP540, BYK9077, Hypermer KD1-SO-(AP), Span65, Span80, Span85, methoxy-ethoxy-ethoxy-acetic acid, oleylamine, oleic acid, stearic acid, Poly(maleic anhydride-alt-1-octadecene), and TOPO.

In a further preferred embodiment the surfactant is selected from the following list: SP 13300, SP 20000, SP 24000SC, SP 41000, SP540, BYK9077, Hypermer KD1-SO-(AP), Span65, Span80, Span85, methoxy-ethoxy-ethoxy-acetic acid, stearic acid, Poly(maleic anhydride-alt-1-octadecene), and TOPO, hexadecylamine, octadecylamine, dioctylamine.

In a further embodiment, the surfactants are selected from the group of anionic, cationic, non-ionic and zwitter-ionic surfactants comprising apolar end-groups selected from the group of alkyl or alkyl-ether chains with 4-30, preferably 6-24, most preferably 8-20 carbon atoms.

In a further embodiment, the surfactants are selected from the group of anionic, cationic, non-ionic and zwitter-ionic surfactants having one or more chemical moieties selected from the group of alkyl ethers with the formula RO-($C_2H_4$O)$_m$($C_3H_6$O)$_n$— (whereby m and n independently are 0-10, but m+n>2 and whereby R is $C_{1-5}$-alkyl)

In a further embodiment, anionic surfactants are selected from monocarboxylic acids comprising a polyether tail according to formula (II), $$R(OC_nH_{2n})_qOCH_2C(O)OH \tag{II}$$

wherein R is $C_{1-5}$-alkyl, q is an integer from 0 to 5 and n is an integer from 1 to 3. Five particularly preferred compounds of that class are:

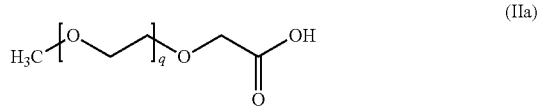
(IIa)

wherein q is from 0-4. This corresponds to a compound of formula (II), wherein R=Methyl, n=2 and q is an integer from 0-4. A particularly preferred compound of that class is

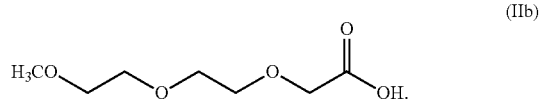 [SMILES: COCCOCCOCC(=O)O]
(IIb)

Dispersing process: Suitable dispersing processes include dispersing methods comprising milling balls. In a preferred embodiment the dispersing method is ball-milling preferably by the use of an agitator ball mill. In a preferred embodiment the ball size is below 5 mm, preferably below 500 microns. In a further embodiment the dispersing method is ball-milling with a ball size between 10-1000 μm, preferably 20-500 μm. In a further embodiment the dispersing method is ball-milling with a specific power input per weight of suspension of at least 10 W/kg, preferably 100 W/kg, most preferably 1000 W/kg. In one further embodiment, the suspension temperature during the dispersing process is below 140° C., preferably below 120° C., most preferably below 70° C. It was surprisingly found that solid materials as defined above can be converted to LCs/QDs with excellent optical properties (high quantum yield, small FWHM) by the use of agitated milling balls, providing LCs/QDs with excellent properties and at low reaction temperatures. This is considered a significant advantage over the known methods.

In a further embodiment of the inventive method, the weight ratio solid material:liquid material (solvent+prepolymer+surfactant) is in the range of 0.0001-0.5, preferably 0.0005-0.1, most preferably 0.001-0.05.

In a further embodiment of the inventive method, the weight ratio surfactant:solid material is in the range of 100-0.1, preferably 50-0.5, most preferably 20-1.

Post-Processing: In a further embodiment, the assynthesized LCs/QDs may be subject to post-processing, such as outlined below in steps (b-2) (b-3), (b-4), and (b-5).

In one embodiment of such post-processing, the halide atom X of synthesized LCs/QD's can be replaced fully or partially with other halide atoms by anion exchange. In particular alkali halides, such as NaI, KI, LiI, and lead halides, such as PbI2, may be used for the anion exchange (b-2). This allows fine-tuning of the emission peak.

In a further embodiment of such post-processing two or more types of luminescent crystals of formula (I) are mixed. By mixing different types of luminescent crystals, e.g. by combining two suspensions comprising such luminescent crystals, the emission peak of the composition is tuned. (b-5)

In a further embodiment, compositions of the present inventions may be purified from excess surfactant by diafiltration of synthesized compositions. (b-3)

In a further embodiment, the LCs/QD solid content of compositions of the present inventions may be increased by diafiltration or solvent evaporation of synthesized compositions. (b-4)

In a second aspect, the invention relates to a composition in the form of a suspension, also termed "ink", and its uses. This aspect of the invention shall be explained in further detail below.

Accordingly, the invention also provides for a composition in the form of a suspension comprising (i) luminescent crystals of formula (I) as described herein; (ii) surfactant as described herein but excluding oleyl amine, oleic acid and trioctylphosphine; and (iii) optionally solvent as described herein; and (iv) optionally polymer or pre-polymer as described herein. Such compositions are novel and may be obtained by the inventive method, as described in the first aspect of this invention.

In one embodiment the invention provides for a composition in the form of a suspension comprising (i) luminescent crystals of formula (I) as described herein; (ii) surfactant selected from the group of non-ionic, anionic, cationic and zwitter-ionic surfactants; but excluding oleyl amine, oleic acid and trioctylphosphine; (iii) optionally solvent as described herein, said solvent preferably selected from the group of aliphatic hydrocarbons (including linear, branched and cyclic hydro-carbons), aromatic hydrocarbons, ethers (including glycol-ethers), esters, alcohols, ketones; and (iv) optionally polymer or pre-polymer as describe herein, said polymer or pre-polymer preferably selected from the group of acrylates, epoxies, urethanes, styrenes, silicones and cyclic olefinic copolymers.

In one embodiment the invention provides for suspensions where the quantum yield thereof is >20%, preferably >50%, most preferably >70%.

In a further embodiment the invention provides for suspensions where the FWHM of LCs/QDs for visible emissions is <50 nm, preferably, <40 nm, most preferably <30 nm.

In a further embodiment the invention provides for suspensions where the FWHM of LCs/QDs having an emission peak between 480-550 nm or between 600-680 nm is <40 nm, preferably, <30 nm, most preferably <20 nm.

In a further embodiment the invention provides for suspensions where the FWHM of LCs/QDs having an emission peak between 480-530 nm is <40 nm, preferably, <30 nm, most preferably <20 nm.

The amount of components (i), (ii), (iii) and (iv) may vary over a broad range and depends inter alia on its intended use and the nature of surfactant.

In one embodiment, the weight ratio luminescent crystals (i):liquid material (ii)+(iii)+(iv) is in the range of 0.0001-0.5, preferably 0.0005-0.3, most preferably 0.001-0.1.

In one further embodiment, the weight ratio surfactant (ii):luminescent crystals (i) is in the range of 100-0.05, preferably 50-0.2, most preferably 20-1.

In one further embodiment, the polymer or pre-polymer concentration is in the range of 0.1-30 wt %, preferably 0.5-20 wt %, most preferably 1-10 wt % of the total composition.

As outlined above, component (i) and (ii) are mandatory, while component (iii) and (iv) are optional. The invention thus relates to inks containing (i.e. comprising or consisting of):
  components (i), (ii) whereby (ii) is liquid, no (iii) no (iv);
  components (i), (ii), (iii), no (iv);
  components (i), (ii), (iv), no (iii);
  components (i), (ii), (iii) and (iv).

In one further embodiment, the composition comprises component (i), (ii), (iii) and (iv), wherein component (ii) comprises aromatic hydrocarbons, preferably toluene and component (iv) comprises cyclic olefin copolymers.

In one further embodiment, the composition comprises component (i), (ii), (iii) and (iv), wherein component (ii) comprises linear alkanes and/or aromatic hydrocarbons and component (iv) comprises styrene copolymers and/or styrene block-copolymers.

Solvent-free ink: The invention provides for compositions in the form of a suspension as described herein, comprising components (i), (ii) and (iv), but which is free of, or essentially free of, solvents (iii). In this embodiment, the weight ratio LCs/QDs (i):liquid material (pre-polymer (iv)+ surfactant(ii)) preferably is in the range of 0.0001-0.5, preferably 0.0005-0.3, most preferably 0.001-0.1. Such composition may be termed solvent-free inks and are particularly suitable for supplying it to manufacturers of intermediates or devices as discussed below.

Pre-polymers particularly suitable for solvent-free inks include acrylates, epoxies, urethanes, silicones, styrenes. Again, the term pre-polymers includes monomers and oligomers thereof. Preferably solvent-free inks include acrylates.

An ink is considered solvent-free when containing less than 10 wt % solvent, preferably less than 1 wt % solvent.

In a further embodiment the solvent-free ink further comprises a polymeriziation initiator, such as a radical photoinitiator or a temperature sensitive radical initiator.

Concentrate: The invention provides for compositions in the form of a suspension as described herein, which is free of, or essentially free of, solvents (iii), which is free of or essentially free of pre-polymer (iv) and wherein surfactant (ii) is a liquid surfactant. In this embodiment, the weight ratio surfactant (ii):LCs/QDs (i) preferably is in the range of 100-1, preferably 50-2, most preferably 20-10.

The inks as described herein find many applications, they are particularly useful for converting blue light into white light, particularly with the use of a light emitting diode (LED).

In a third aspect, the invention relates to a solid polymer composition and its uses. The term solid polymer composition denotes an organic or inorganic polymer matrix comprising LCs/QD's as described herein. This aspect of the invention shall be explained in further detail below.

In one embodiment, the invention provides for a solid polymer compositions comprising (i) LCs/QDs as described herein, (ii) surfactants as described herein but excluding oleyl amine, oleic acid and trioctylphosphine and (iii) a hardened/cured polymer, preferably selected from organic polymers.

In a further embodiment the organic polymer is preferably selected from the list of acrylate polymers, carbonate polymers, sulfone polymers, epoxy polymers, vinyl polymers, urethane polymers, imide polymers, ester polymers, furane polymers, melamine polymers, styrene polymers and silicone polymers. Accordingly, said polymer preferably contains repeating units of pre-polymers as described herein. Furthermore the polymer can be linear or cross-linked.

In a further embodiment the organic polymer is preferably selected from the list of acrylate polymers, epoxy polymers, urethane polymers, styrene polymers, silicone polymers and cyclic olefin copolymers. Accordingly, said polymer preferably contains repeating units of pre-polymers as described herein. Furthermore the polymer can be linear or cross-linked.

In one embodiment, the organic polymer comprises styrene copolymers and/or styrene block-copolymers, preferably block-copolymers of styrene and isoprene and block-copolymers of styrene, ethylene and butene.

In one embodiment, the weight ratio LCs/QDs:matrix (polymer+surfactant) in said solid polymer composition is in the range of 0.0001-0.1, preferably 0.0005-0.05, most preferably 0.001-0.02.

In one embodiment, the weight ratio surfactant:LCs/QDs in said solid polymer composition is in the range of 100-0.05, preferably 50-0.2, most preferably 20-1.

In a further embodiment the quantum yield of solid polymer compositions of the present invention is >20%, preferably >50%, most preferably >70%

In a further embodiment the FWHM of solid polymer compositions of the present invention for visible emissions is <50 nm, preferably, <40 nm, most preferably <30 nm.

In a fourth aspect, the invention relates to an intermediate good comprising a sheet-like substrate coated with one or more layers, wherein at least one of said layers is a functional layer, wherein said functional layer comprises a solid polymer composition as described herein. This aspect of the invention shall be explained in further detail below.

In an advantageous embodiment, functional layer converts blue light into white light. The invention thus provides for the use of a solid polymer composition for converting blue light into white light, particularly with the use of a light emitting diode (LED) or in a liquid crystal display.

In a fifth aspect, the invention relates to novel devices/articles. This aspect of the invention shall be explained in further detail below.

In one embodiment, the invention provides for a device, selected from the group of electronic devices and optical devices, wherein said device comprises a substrate and a functional layer; and wherein said functional layer comprises LCs/QDs of formula (I) as described herein and surfactant as described herein, but excluding oleyl amine, oleic acid and trioctylphosphine. Such device may be selected from the group consisting of displays, mobile devices, light emitting devices, and solar cells, particularly wherein the device is a liquid crystal display or a quantum dot LED (QLED).

In one embodiment, the invention provides for an article comprising a substrate and a coating, particularly a decorative coating, said coating comprises LCs/QDs of formula (I) as described herein and surfactant as described herein, but excluding oleyl amine, oleic acid and trioctylphosphine.

In a sixth aspect, the invention relates to a method of manufacturing polymer compositions as described herein. The method comprises the steps known in the art, but by using an ink as described herein as one, or the sole, starting material.

In a seventh aspect, the invention relates to a method of manufacturing intermediate goods as described herein. This aspect of the invention shall be explained in further detail below.

The intermediate goods according to the present invention may be obtained by solution processes. This is considered a significant advantage, as it enables manufacturing of all layers by simple technologies applicable to large areas and continuous processing. Accordingly, the invention also provides methods for manufacturing an intermediate good as described herein, said method comprising the step of (e) providing a substrate and (f) depositing a solid polymer composition as described herein on said substrate, preferably by coating or printing of an ink as described herein followed by drying and/or curing.

In an eight aspect, the invention relates to a method of manufacturing electronic devices as described herein. This aspect of the invention shall be explained in further detail below.

The manufacturing of devices starting from the above described intermediate goods is known per se, but not yet applied to the specific intermediate goods of the present invention.

To further illustrate the invention, the following examples are provided. These examples are provided with no intent to limit the scope of the invention. If not stated otherwise, all of the chemicals were purchased from Aldrich.

Example 1: Synthesis from Solid Material Obtained by Precipitation Method

Cesium lead tribromide ($CsPbBr_3$) was synthesized by mixing PbBr2 and CsBr in acidic conditions. Namely, 2 mmol $PbBr_2$ (0.731 g, 98% ABCR) was dissolved in 3 ml of concentrated HBr (48%, AlfaAesar). 2 mmol CsBr (0.426 g, 99.9% ABCR) was dissolved in 1 ml $H_2O$ and added to $PbBr_2$ solution. A bright orange solid immediately precipitated from the solution. The solid was filtered, washed four times with absolute EtOH and dried under vacuum for 5 h to obtain 1.12 g of pure orthorhombic CsPbBr3 (96.8% yield). This material does not show any luminescence. SEM analysis showed that the average particle size is in the range of 0.5-6 microns. The dried $CsPbBr_3$ powder was added to Oleylamine (70%, Aldrich) ($CsPbBr_3$:Oleylamine=1:10) and Toluene (>99.7%, Fluka). The final concentration of $CsPbBr_3$ was 1%. The mixture was then dispersed by ball milling by using Yttrium stabilized zirconia beads with a size of 200 microns at ambient conditions for a period of 1 h yielding an ink with green luminescence. Absorption and luminescence properties of the ink were recorded in air-equilibrated solutions placed in a 10 mm quartz cuvette with a Perkin Elmer Lambda spectrophotometer and a Perkin Elmer LS50B spectrofluorimeter equipped with a Hamamatsu R928 phototube, respectively. The ink was diluted with toluene until the absorbance value did not exceed 0.1 at the excitation wavelength.

The photoluminescence quantum yield of above ink was 71% with an emission peak centered at 507 nm. The FWHM of the emission was determined as 19 nm. Fluorescein (Analytical Reference grade, Aldrich) solution in 0.1 M NaOH was used as the photoluminescence quantum yield standard.

Figure 2:
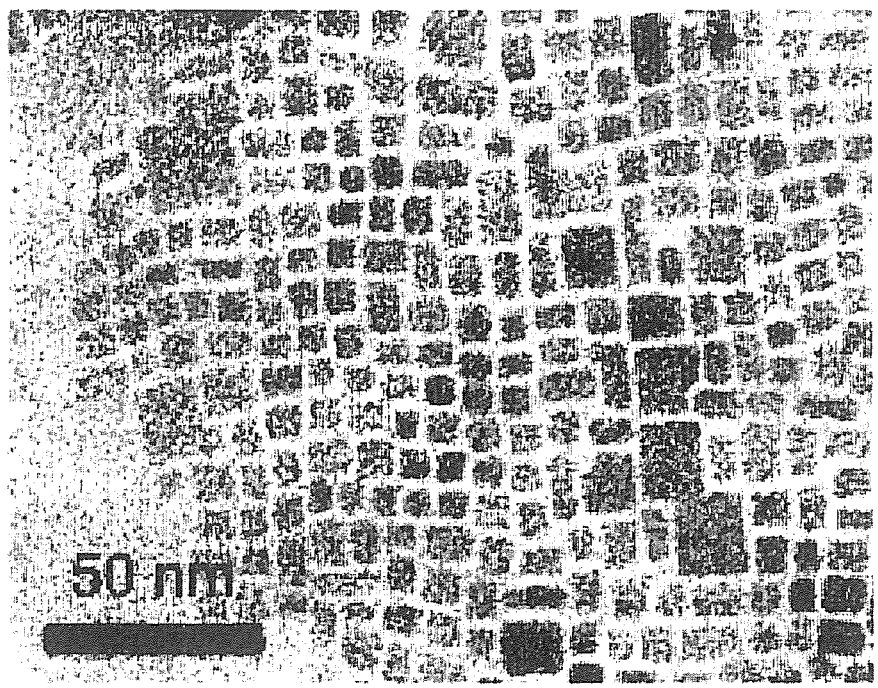
FIG. 2 shows a TEM image of typical QD's synthesized according to the present invention, showing the cubic nature of the crystal structure.
Figure 3:
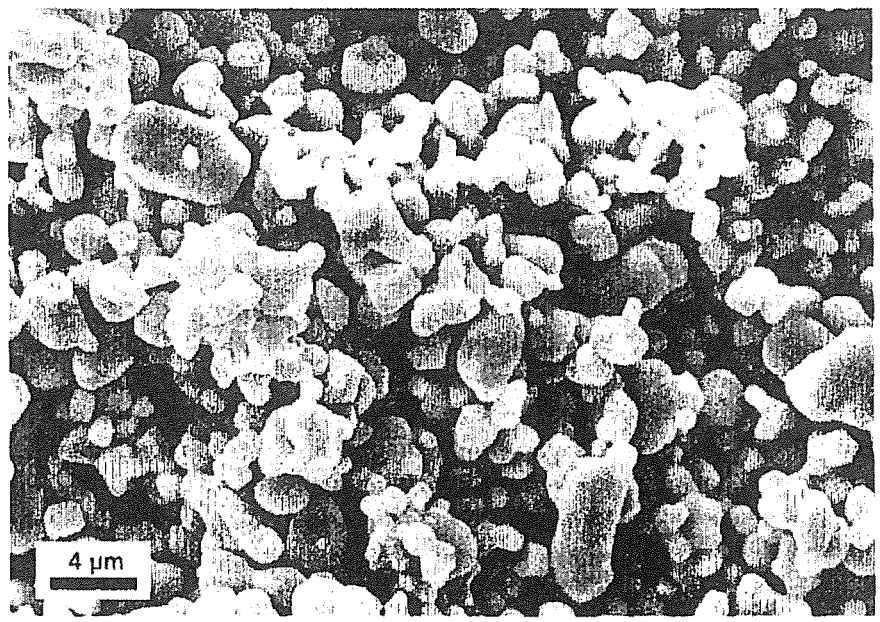
FIG. 3 shows an SEM image of a typical starting solid material powder prepared by precipitation.

TEM analysis of the ink (FIG. 2) showed the presence of cubic shaped particles with a very narrow particle size distribution.

For the XRD analysis of the ink, QDs were precipitated by acetonitrile and dried for analysis. Cubic $CsPbBr_3$ was the dominant phase.

The experiment above was repeated but with pure methylmethacrylate instead of toluene. The final ink showed a slightly blue-shifted emission.

Example 2: Synthesis from Solid Material Obtained by Flame Spray Pyrolysis

For the preparation of $CsPbBr_3$ precursor 2.5 mmol cesium acetate (0.48 g, ABCR), 2.5 mmol lead 2-ethylhexanoate (1.23 g, Strem) was added to 2-ethylhexanoic acid (Aldrich) and dissolved by heating the mixture for 1 hour at 150° C. After cooling to room temperature 7.5 mmol bromobenzene (1.18 g, Aldrich) was added to the mixture. The obtained solution was diluted with xylene 1:2 by weight. The precursor was fed (9 ml $min^{-1}$, HNP Mikrosysteme, micro annular gear pump mzr-2900) to a spray nozzle, dispersed by oxygen (9 l $min^{-1}$, PanGas tech.) and ignited by a premixed methane-oxygen flame ($CH_4$: 1.2 l $min^{-1}$, $O_2$: 2.2 l $min^{-1}$). The off-gas was filtered through a glass fiber filter (Schleicher & Schuell) by a vacuum pump (Busch, Secc SV1040CV) at about 20 $m^3$ $h^{-1}$. The obtained oxide powder was collected from the glass fiber filter. XRD analysis of the obtained powder confirmed the composition of CsPbBr$_3$. SEM analysis showed that the average particle size is below 500 nm.

The CsPbBr$_3$ powder was added to Span65 (Aldrich) (CsPbBr$_3$:Span65=1:10) and Toluene (>99.7%, Fluka). The final concentration of CsPbBr$_3$ was 0.2%. The mixture was then dispersed by ball milling by using Yttrium stabilized zirconia beads with a size of 50 microns at ambient conditions for a period of 30 min yielding an ink with green luminescence. Absorption and luminescence properties of the ink were recorded as presented in Example 1. The photoluminescence quantum yield of above ink was 37% with an emission peak centered at 511 nm. The FWHM of the emission was determined as 25 nm.

For the XRD analysis of the ink, QDs were precipitated by acetonitrile and dried for analysis. Cubic CsPbBr$_3$ was the dominant phase.

Example 3: Synthesis from Solid Material Composed of a Mixture of Two Different Precursors Commercial CsBr (99.9%, ABCR) and PbBr$_2$ (98%, ABCR) powders were mixed in equal molar ratio leading to a net stoichiometric composition of CsPbBr$_3$. The salt mixture was added to Oleylamine (70%, Aldrich) (CsPbBr$_3$:Oleylamine=1:10) and Toluene (>99.7%, Fluka). The final concentration of CsPbBr$_3$ was 0.2%. The mixture was then dispersed by ball milling by using Yttrium stabilized zirconia beads with a size of 50 microns at ambient conditions for a period of 150 min yielding an ink with green luminescence. Absorption and luminescence properties of the ink were recorded as presented in Example 1. The photoluminescence quantum yield of above ink was 48% with an emission peak centered at 503 nm. The FWHM of the emission was determined as 37 nm.

For the XRD analysis of the ink, QDs were precipitated by acetonitrile and dried for analysis. Cubic CsPbBr$_3$ was the dominant phase.

Example 4: Synthesis from Solid Material Obtained by Precipitation Method with Different Dispersing Method Cesium lead dibromide iodide (CsPbBr$_2$I) was synthesized by mixing PbBr$_2$ and CsI from methyl sulfoxide (DMSO) solutions. Namely, 1 mmol PbBr$_2$ (0.367 g, 98% ABCR) was dissolved in 2 ml of DMSO (>99.7%, Acros). 1 mmol CsI (0.259 g, 99.9%, Alfa Aesar) was dissolved in 1 ml DMSO and added to PbBr$_2$ solution. After addition of 20 ml toluene (99.7%, Fluka) a bright red solid immediately precipitated from the solution. The solid was filtered, washed four times with absolute EtOH and dried under vacuum for 5 h to obtain 0.58 g of pure orthorombic CsPbBr$_2$I (92.6% yield). This material does not show any luminescence.

0.02 g of the obtained salt was placed in a 30 ml glass vial containing 9.78 g tetradecane (99%, Aldrich), 0.2 g oleylamine (70%, Aldrich), 10 g Yttrium stabilized zirconia beads with a size of 50 microns and 3 cm magnet bar. The mixture was mixed at 1000 rpm, 120° C. for 4 h. After cooling down to room temperature the ink was filtered through a 0.45 um PTFE filter and yellow luminescence was observed. Absorption and luminescence properties of the ink were recorded as presented in Example 1. The photoluminescence was characterized by an emission peak centered at 552 nm, with FWHM of the emission peak of 30 nm.

The following further experiments were all conducted by ball milling using similar process parameters (LCs/QDs:surfactant ratio=1:10, milling bead size=50 microns, milling time=30 min, LCs/QDs concentration in the ink=0.2%, filtered by 0.45 um PTFE syringe filter for optical characterization, optical characterization was identical as in Example 1):

| Example # | Solid material | Surfactant | solvent | Peak emission/ FWHM/QY |
|---|---|---|---|---|
| 5 | CsPbBr$_3$ (a1) | Span65 | toluene | Green, 506 nm/ 24 nm/42% |
| 6 | CsPbBr$_3$ (a2) | Oleylamine | toluene | Green, NA/NA/ NA |
| 7 | CsPbBr$_3$ (a2) | Poly(maleic anhydride-alt-1-octadecene) | toluene | Green, NA/NA/ NA |
| 8 | CsPbBr$_3$ (a2) | TOPO | toluene | Green, NA/NA/ NA |
| 9 | CsPbBr$_3$ (a2) | Span65 | Butyl acetate | Green, NA/NA/ NA |

Example 10: Synthesis from Solid Material Obtained Via Dry Milling Method

Cesium lead tribromide (CsPbBr$_3$) was synthesized by milling PbBr$_2$ and CsBr. Namely, 2 mmol PbBr$_2$ (0.731 g, 98% ABCR) and 2 mmol CsBr (0.426 g, 99.9% ABCR) were milled with Yttrium stabilized zirconia beads (2 mm diameter) for 2 h to obtain 1.08 g of pure orthorhombic CsPbBr$_3$ (93.3% yield). This material did not show any luminescence. SEM analysis showed that the average particle size is in the range of 0.5-6 microns.

The orange CsPbBr$_3$ powder was added to Oleylamine (70%, Aldrich) (CsPbBr$_3$:Oleylamine=5:1) and Toluene (>99.7%, Fluka). The final concentration of CsPbBr$_3$ was 1%. The mixture was then dispersed by ball milling by using Yttrium stabilized zirconia beads with a size of 50 microns at ambient conditions for a period of 1 h yielding an ink with green luminescence. Absorption and luminescence properties of the ink were recorded as presented in Example 1.

The photoluminescence quantum yield of above ink was 85% with an emission peak centered at 502 nm. The FWHM of the emission was determined as 19 nm.

The green emitting ink was then mixed with 10% cyclic olefin copolymer (COC, TOPAS Advanced Polymers) solution in toluene, coated on a glass substrate and dried at 60° C. for 15 minutes. After drying the resulting optical properties of film were measured with a spectrofluorimeter equipped with an integrating sphere (Quantaurus Absolute PL quantum yield measuring system C11134711, Hamamatsu). The photoluminescence quantum yield of the film was 80% with an emission peak centered at 502 nm. The FWHM was determined as 19 nm.

Example 11: Post-Synthetic Adjustment of the Emission Wavelength

The solid CsPbBr$_3$ material from example 10 was added to Oleylamine (70%, Aldrich) (CsPbBr3:Oleylamine=2:1) and n-Heptane (99%, Aldrich). The final concentration of CsPbBr$_3$ was 1%. The mixture was then dispersed by ball milling by using Yttrium stabilized zirconia beads with a size of 50 microns at ambient conditions for a period of 1 h yielding an ink with green luminescence. Absorption and luminescence properties of the ink were recorded as presented in Example 1. The photoluminescence quantum yield of above ink was 89% with an emission peak centered at 501 nm. The FWHM of the emission was determined as 20 nm.

Cesium lead triiodide (CsPbI$_3$) was synthesized by milling PbI2 and CsI. Namely, 2 mmol PbI2 (0.922 g, 99%, Aldrich) and 2 mmol CsI (0.519 g, 99%, ABCR) were milled with Yttrium stabilized zirconia beads (2 mm diameter) for 2 h to obtain 1.387 g of pure orthorhombic CsPbI$_3$ (96.2% yield). This material did not show any luminescence.

The yellow CsPbI$_3$ powder was added to Oleylamine (70%, Aldrich) (CsPbBr$_3$:Oleylamine=2:1) and n-Heptane (99%, Aldrich). The final concentration of CsPbI$_3$ was 1%. The mixture was then dispersed by ball milling by using Yttrium stabilized zirconia beads with a size of 50 microns at ambient conditions for a period of 3 h yielding an ink with red luminescence. Absorption and luminescence properties of the ink were recorded as presented in Example 1, however cresyl violet (Aldrich) solution in MeOH was used as the photoluminescence quantum yield standard. The photoluminescence quantum yield of above ink was 61% with an emission peak centered at 674 nm. The FWHM of the emission was determined as 48 nm.

1 ml of the green emitting CsPbBr$_3$ ink was then mixed with 150 μl red emitting CsPbI$_3$ ink. The mixture changed immediately the emission wavelength, which was found to be centered at 529 nm with the photoluminescence quantum yield of 58% and FWHM of 21 nm. There were no traces of photoluminescence coming from original CsPbBr$_3$ ink (501 nm) and CsPbBrI$_3$ ink (676 nm) found.

In a further test, 0.5 ml of the green emitting CsPbBr$_3$ ink was then mixed with 1 ml red emitting CsPbI3 ink. The mixture changed immediately the emission wavelength, which was found to be centered at 640 nm with the photoluminescence quantum yield of 86% and FWHM of 37 nm. Again, there were no traces of photoluminescence coming from original CsPbBr$_3$ ink (501 nm) and CsPbBrI$_3$ ink (676 nm) found.

Example 12: Solvent-Free System 0.5 g of the green emitting ink from example 10 was mixed with 1 g Permabond UV681 UV-curable adhesive (Permabond Engineering Adhesives). The solvent present in the green emitting ink was removed by heating the mixture for 90 minutes at 80° C. The remaining material was then coated between two glass slides and UV cured for 30 s (UVACUBE 100, Honle UV Technology) resulting in a solid polymeric film. The optical properties of resulting film were measured as in example 10. The photoluminescence quantum yield of the film was 77% with an emission peak centered at 502 nm. The FWHM was determined as 19 nm.

Example 13: Composition and Solid Polymer Composition with Styrene Block-Copolymer 0.5 g of the green emitting ink (CsPbBr$_3$ ink) from example was mixed with 5 g of 10 wt % polystyrene-block-polyisoprene-block-polystyrene (Aldrich, styrene 14 wt %) in toluene. The material was then coated on a glass slide and cured at 60° C. resulting in a solid polymeric film. The optical properties of resulting film were measured as in example 10. The photoluminescence quantum yield of the film was 84% with an emission peak centered at 501 nm. The FWHM was determined as 20 nm.

0.5 g of the green emitting ink (CsPbBr3 ink) from example 11 was mixed with 5 g of 10 wt % Polystyrene-block-poly(ethylene-ran-butylene)-block-polystyrene (Aldrich) in n-heptane. The material was then coated on a glass slide and cured at 60° C. resulting in a solid polymeric film. The optical properties of resulting film were measured as in example 10. The photoluminescence quantum yield of the film was 83% with an emission peak centered at 501 nm. The FWHM was determined as 20 nm.

The invention claimed is:

1. A method for manufacturing luminescent crystals of 2-50 nm size,
    said luminescent crystals being selected from compounds of formula (I)

$$M^1_a M^2_b X_c \quad (I),$$

wherein:
        $M^1$ represents one or more alkaline metals selected from Cs, Rb, K, Na, Li,
        $M^2$ represents one or more metals selected from the group consisting of Ge, Sn, Pb, Sb, and Bi,
        X represents one or more halogenides selected from the group consisting of Cl, Br, and I,
        a represents 1-4,
        b represents 1-2,
        c represents 3-9;
    said method comprising the steps of:
        (a) providing a solid material, said solid material (i) having a stoichiometric composition of a moles $M^1$, b moles $M^2$ and c moles X and (ii) having an average particle size of at least 15 nm and a poly-disperse size distribution;
        (b) dispersing said material in the presence of a liquid, whereby said liquid being selected from (i) liquid surfactants, (ii) a combination of surfactant and solvent, (iii) a combination of surfactant, solvent and pre-polymer or polymer and (iv) a combination of surfactant and liquid pre-polymer; and whereby said dispersing is effected by agitated milling balls.

2. The method according to claim 1 whereby dispersing of step (b)
    is effected by agitated milling balls with a ball size between 10-1000 μm; and/or
    is effected with a specific power input per weight of suspension of at least 100 W/kg; and/or
    is effected at a temperature below 120° C.

3. The method according to claim 1, wherein said luminescent crystals are selected from the group of CsPbX$_3$.

4. The method according to claim 1, wherein said solvents are selected from the group of aliphatic hydrocarbons, aromatic hydrocarbons, ethers, esters, alcohols, and ketones.

5. The method according to claim 1, wherein said surfactants are selected from the group of non-ionic, anionic, cationic and zwitter-ionic surfactants.

6. The method according to claim 1, wherein said pre-polymer is selected from the group of acrylates, carbonates, sulfones, epoxies, vinyls, urethanes, imides, esters, furanes, melamines, styrenes, and silicones.

7. The method according to claim 1, wherein in step (a) said solid material
    is obtained by a dry synthetic process selected from a process consisting of; gas phase reaction and dry milling; or
    by a wet synthetic process; or
    is in situ formed by stoichiometric reaction of two or more precursors that comply with the net stoichiometric composition of formula (I).

8. The method according to claim 7, wherein
    said dry synthetic process is a gas phase process including decomposition and pyrolysis processes;

said wet synthetic process is a precipitation process from a solvent based or aqueous phase; and said in situ formation takes place upon ball-milling the starting materials in the presence of surfactant and optionally solvent and/or liquid pre-polymer, wherein the surfactant is liquid if the solvent and/or liquid pre-polymer are not present.

9. The method according to claim 1, wherein:
the weight ratio of said solid material:liquid material (solvent+surfactant) is in the range of 0.0001-0.5; or
the weight ratio of said surfactant:solid material is in the range of 100-0.1.

10. The method according to claim 1 further comprising:
the step of replacing one or more halide atom X of synthesized luminescent crystals with other halide atoms by anion exchange; and/or
the step of combining two or more types of luminescent crystals of formula (I).

11. The method according to claim 1, wherein said pre-polymer is an acrylate.

12. A composition in the form of a suspension comprising:
(i) luminescent crystals of 2-50 nm size of formula (I):

$$M^1_a M^2_b X_c \qquad (I),$$

wherein:
M$^1$ represents one or more alkaline metals selected from Cs, Rb, K, Na, Li,
M$^2$ represents one or more metals selected from the group consisting of Ge, Sn, Pb, Sb, and Bi,
X represents one or more halogenides selected from the group consisting of Cl, Br, and I,
a represents 1-4,
b represents 1-2,
c represents 3-9; and
(ii) surfactant selected from the group of non-ionic, anionic, cationic and zwitter-ionic surfactants; but excluding oleyl amine, oleic acid and trioctylphosphine; and
(iii) optionally solvent, said solvent selected from the group of aliphatic hydrocarbons, esters, alcohols, ketones; and
(iv) optionally polymer or pre-polymer selected from the group of acrylates, epoxies, urethanes, styrenes, silicones and cyclic olefinic copolymers.

13. The composition according to claim 12, wherein
the weight ratio luminescent crystals (i):liquid material (ii)+(iii)+(iv) is in the range of 0.0001-0.5; and/or
the weight ratio surfactant (ii):luminescent crystals (i) is in the range of 100-0.05; and/or
wherein the polymer or pre-polymer concentration is in the range of 0.1-30 wt %, of the total composition.

14. A composition according to claim 12,
wherein the surfactant is selected from the group of anionic, cationic, non-ionic and zwitter-ionic surfactants; and
wherein said surfactants comprise apolar end-groups selected from the group of alkyl or alkyl-ether chains with 4-30 carbon atoms.

15. A composition according to claim 12,
which is free of solvents (iii), and
wherein the weight ratio luminescent crystals (i):liquid material (pre-polymer (iv)+surfactant(ii)) is in the range of 0.0001-0.5.

16. A composition according to claim 12,
wherein said surfactant (ii) is a liquid surfactant and which is free of, solvents (iii) and pre-polymer (iv), and wherein the weight ratio surfactant (ii):luminescent crystals (i) is in the range of 100-1.

17. A solid polymer composition comprising:
(ii) luminescent crystals of 2-50 nm size of formula (I):

$$M^1_a M^2_b X_c \qquad (I),$$

wherein:
M$^1$ represents one or more alkaline metals selected from Cs, Rb, K, Na, Li,
M$^2$ represents one or more metals selected from the group consisting of Ge, Sn, Pb, Sb, and Bi,
X represents one or more halogenides selected from the group consisting of Cl, Br, and I,
a represents 1-4,
b represents 1-2,
c represents 3-9;
and
(iii) surfactant selected from the group of non-ionic, anionic, cationic and zwitter-ionic surfactants; but excluding oleyl amine, oleic acid and trioctylphosphine; and
(iv) a hardened/cured polymer.

18. The solid polymer composition according to claim 17, wherein
the weight ratio of said luminescent crystals:matrix (polymer+surfactant) is in the range of 0.0001-0.1; or
the weight ratio of said surfactant:luminescent crystals is in the range of 100-0.05.

19. A composition according to claim 17 for converting blue light into white light.

20. The solid polymer composition of claim 17, wherein the hardened/cured polymer is selected from the group of acrylate polymers, epoxy polymers, urethane polymers, styrene polymers, silicone polymers and cyclic olefin copolymers.

21. A composition according to claim 17 for converting blue light into white light in a light emitting diode (LED) or in a liquid crystal display.

22. An intermediate good comprising a sheet-like substrate coated with one or more layers, wherein at least one of said layers is a functional layer, wherein said functional layer comprises a composition according to claim 17.

23. An intermediate good according to claim 22, wherein said functional layer converts blue light into white light.

24. A device, selected from the group of electronic devices and optical devices, wherein said device comprises a substrate and a functional layer; and wherein said functional layer comprises luminescent crystals of formula (I):

$$M^1_a M^2_b X_c \qquad (I),$$

wherein:
M$^1$ represents one or more alkaline metals selected from Cs, Rb, K, Na, Li,
M$^2$ represents one or more metals selected from the group consisting of Ge, Sn, Pb, Sb, and Bi,
X represents one or more halogenides selected from the group consisting of Cl, Br, and I,
a represents 1-4,
b represents 1-2,
c represents 3-9;
and surfactant selected from the group of non-ionic, anionic, cationic and zwitter-ionic surfactants, but excluding oleyl amine, oleic acid and trioctylphosphine.

25. The device according to claim 24, selected from the group consisting of displays, mobile devices, light emitting devices, and solar cells.

26. A device according to claim 24, selected from the group consisting of LCD displays or a quantum dot LEDs.

27. An article comprising a substrate and a coating, said coating comprising luminescent crystals of formula (I):

   (I), wherein:
- $M^1$ represents one or more alkaline metals selected from Cs, Rb, K, Na, Li,
- $M^2$ represents one or more metals selected from the group consisting of Ge, Sn, Pb, Sb, and Bi,
- X represents one or more halogenides selected from the group consisting of Cl, Br, and I,
- a represents 1-4,
- b represents 1-2,
- c represents 3-9;

and surfactant selected from the group of non-ionic, anionic, cationic and zwitter-ionic surfactants, but excluding oleyl amine, oleic acid and trioctylphosphine.

28. A method for manufacturing an intermediate good comprising a sheet-like substrate coated with one or more layers, wherein at least one of the layers is a functional layer, the method comprising the steps of:
(a) providing a substrate, and
(b) depositing a solid polymer composition according to claim 17 to said substrate, the solid polymer composition formed by applying a suspension comprising the luminescent crystals, the surfactant and at least one polymer or pre-polymer selected from the group of acrylates, epoxies, urethanes, styrenes, silicones and cyclic olefinic copolymers, followed by drying and/or curing, said solid polymer composition being said functional layer.

* * * * *